(12) United States Patent
Wu

(10) Patent No.: US 9,065,412 B2
(45) Date of Patent: Jun. 23, 2015

(54) AUDIO AMPLIFIER CIRCUIT AND METHOD THEREOF

(75) Inventor: Hung Sheng Wu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 478 days.

(21) Appl. No.: 13/415,092

(22) Filed: Mar. 8, 2012

(65) Prior Publication Data

US 2013/0064395 A1 Mar. 14, 2013

(30) Foreign Application Priority Data

Sep. 8, 2011 (TW) .............................. 100132346 A

(51) Int. Cl.
*H03G 3/00* (2006.01)
*H03G 3/30* (2006.01)

(52) U.S. Cl.
CPC ........... *H03G 3/3005* (2013.01); *H03G 3/3089* (2013.01)

(58) Field of Classification Search
CPC ............. H03G 3/00; H03G 3/20; H03G 3/30; H03G 3/3005; H03G 3/001; H03G 3/004; H03G 3/005; H03G 3/301; H03G 3/3089
USPC ........... 381/104, 106–109, 120; 330/254, 278
See application file for complete search history.

(56) References Cited

U.S. PATENT DOCUMENTS

| | | | | |
|---|---|---|---|---|
| 4,792,977 A | * | 12/1988 | Anderson et al. | 381/321 |
| 5,822,442 A | * | 10/1998 | Agnew et al. | 381/107 |
| 8,787,595 B2 | * | 7/2014 | Urata | 381/107 |
| 2003/0035549 A1 | * | 2/2003 | Bizjak et al. | 381/56 |
| 2007/0127737 A1 | | 6/2007 | Lee | |
| 2008/0123873 A1 | * | 5/2008 | Bjorn-Josefsen et al. | 381/106 |
| 2009/0154733 A1 | * | 6/2009 | Lesso et al. | 381/120 |
| 2010/0027812 A1 | * | 2/2010 | Moon et al. | 381/107 |
| 2010/0128912 A1 | * | 5/2010 | Schiller | 381/321 |

FOREIGN PATENT DOCUMENTS

CN 1983805 A 6/2007

OTHER PUBLICATIONS

Communication From the Chinese Patent Office (W/ Partial Translation) Regarding a Counterpart Foreign Application Dated Jan. 21, 2015.

* cited by examiner

*Primary Examiner* — Vivian Chin
*Assistant Examiner* — Friedrich W Fahnert
(74) *Attorney, Agent, or Firm* — Rosenberg, Klein & Lee

(57) ABSTRACT

An audio amplifier circuit and a method of the same are provided. The audio amplifier circuit includes a processor, a pre-processing module, and a post-processing module. The processor controls a pre-gain value of the pre-processing module and a post-gain value of the post-processing module in accordance with a volume adjustment signal so as to process an audio input signal and generate an audio output signal. The pre-gain value and the post-gain value are dynamically adjusted by the audio amplifier circuit and a method thereof by according to the volume adjustment signal so as to generate low distortion, low noise audio output signals and improve audio playback quality of an audio output device.

12 Claims, 4 Drawing Sheets

AUDIO AMPLIFIER CIRCUIT AND METHOD THEREOF

BACKGROUND OF THE INVENTION

1. Field of the Invention

The present invention relates to an audio amplifier circuit and a method of the same, especially to an amplifier circuit that dynamically adjusts an audio output signal and a method of the same.

2. Description of Related Art

Along with fast development of modern technology, the design of audio output devices has become more precise. For providing users high quality sounds, manufacturers develop various types of audio output devices, each of which focused on specific sound field.

However, most of the audio output devices available now have problems of distortion and noises. The distortion causes voices output by the audio output devices changes while the noises have negative effect on the playback quality of the audio output devices. In order to reduce negative effects of the distortion and the noises on the output voices, designers have tries in different ways.

In an amplifier circuit of the audio output device available now, both a pre-gain value and a post-gain value are fixed values, unable to be adjusted after the audio output device being manufactured. When users adjust the output volume level into low level or high level, the conventional amplifier circuit amplifiers noises or causes distortion of audio output signals. Thus an audio output signal generated by the conventional amplifier circuit that amplifies the audio input signal by the fixed gain value also comprises the amplified noises or distortion. Therefore the playback quality of the audio output device is reduced. The design of conventional amplified circuit leads to limited playback quality of the audio output device and users can't have better listening quality.

Thus there is room for improvement and a need to provide an audio amplifier circuit that overcomes shortcomings of conventional amplifier circuit of audio output devices such as distortion and noise problems.

SUMMARY OF THE INVENTION

Therefore, an object of the present invention is to provide an audio amplifier circuit and a method of the same that dynamically output a low-noise, low-distortion audio output signal. A pre-gain value of a pre-processing module and a post-gain value of a post-processing module are controlled in accordance with a volume adjustment signal so as to process an audio input signal and generate an audio output signal. Thus, the pre-gain value and the post-gain value are dynamically adjusted by the audio amplifier circuit according to the volume adjustment signal to provide the audio output signal with low distortion and low noise and further improve audio playback quality of an audio output device.

According to one embodiment of the present invention, an audio amplifier circuit includes a processor, a pre-processing module and a post-processing module. The processor receives a volume adjustment signal and generates a pre-control signal and a post-control signal according to the volume adjustment signal. The pre-control signal and the post-control signal are respectively corresponding to a pre-gain value and a post-gain value. The pre-processing module receives an audio input signal and the pre-control signal and processes the audio input signal according to the pre-control signal to generate a pre-audio signal. The post-processing module receives the pre-audio signal and the post-control signal and processes the pre-audio signal according to the post-control signal to generate an audio output signal.

According to another embodiment of the present invention, an audio amplification method is provided. The method includes following steps. After receiving an audio input signal and a volume adjustment signal, a pre-control signal and a post-control signal are generated according to the volume adjustment signal. Transmitting the pre-control signal and the post-control signal respectively to a pre-processing module and a post-processing module. The pre-control signal and the post-control signal are respectively corresponding to a pre-gain value and a post-gain value. Thereby the pre-processing module processes the audio input signal according to the pre-control signal to generate a pre-audio signal while the post-processing module processes the pre-audio signal according to a post-control signal to generate an audio output signal.

BRIEF DESCRIPTION OF THE DRAWINGS

The structure and the technical means adopted by the present invention to achieve the above and other objects can be best understood by referring to the following detailed description of the embodiments and the accompanying drawings, wherein.

DETAILED DESCRIPTION

An audio amplifier circuit and a method of the same according to the present invention can be applied to an audio output device of an electronic such as an audio output device of televisions, an audio output device of notebooks, an audio output device of transportation vehicles, etc. There is no limit on the electronics.

Figure 1:
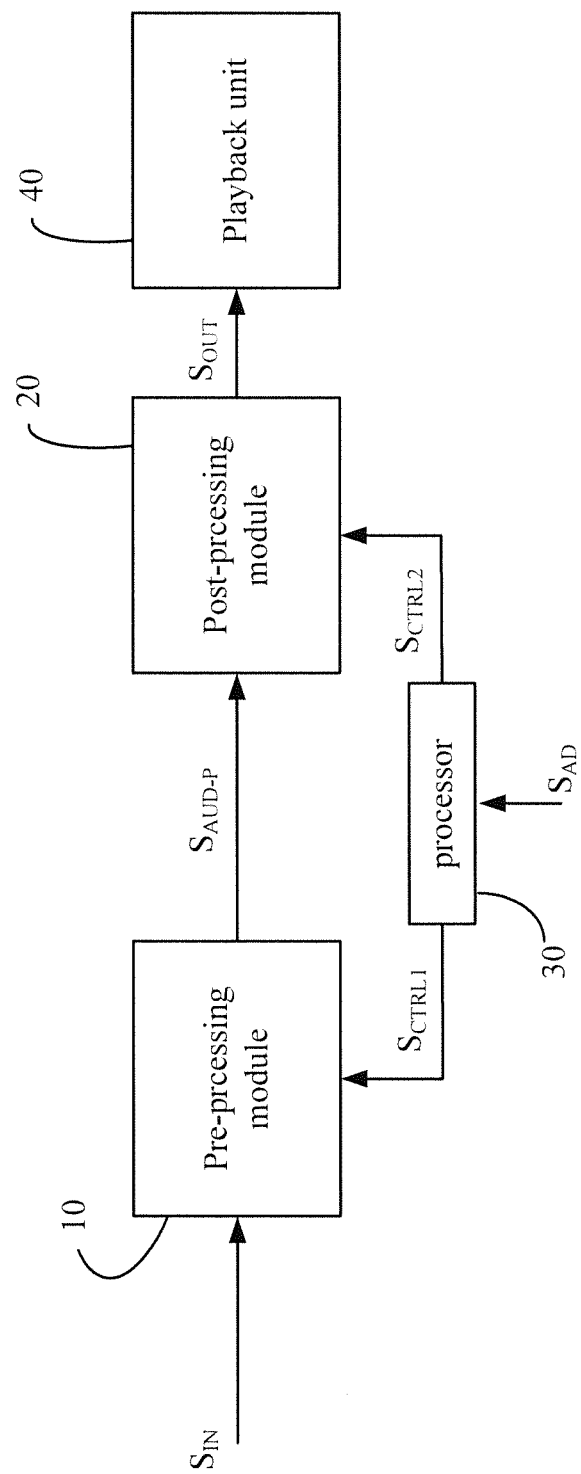
FIG. 1 is a block diagram of an embodiment according to the present invention.

An audio output signal $S_{OUT}$ is output by an audio amplifier circuit and a method of the same according to the present invention is low-noise and low-distortion so that original sound of an audio input signal $S_{IN}$ can be played to users completely. Refer to FIG. 1, an audio amplifier circuit of audio output devices comprises a pre-processing module 10, a post-processing module 20 and a processor 30. The audio amplifier circuit is used to reduce distortion and noises of the audio output signal $S_{OUT}$. Thus a playback unit 40 of the audio output device plays the audio output signal $S_{OUT}$ and shows original sound of the audio input signal $S_{IN}$.

The pre-processing module 10 is used to receive and process the audio input signal $S_{IN}$ so as to generate a pre-audio signal $S_{AUD-P}$. The audio input signal $S_{IN}$ may come from storage media such as optical disks, portable storage device including USB storage disks and memory cards, Internet servers etc. The pre-processing module 10 applies common audio processing including equalization, stereo processing, multi-channel processing, etc to the audio input signal $S_{IN}$. These are techniques available now. Moreover, there is a pre-gain value of the pre-processing module 10. According to the pre-gain value, the pre-processing module 10 processes the audio input signal $S_{IN}$ to generate and output the pre-audio signal $S_{AUD-P}$ to the post-processing module 20. The pre-processing module 10 is not necessary to apply common audio processing to the audio input signal $S_{IN}$. It can deal with the audio input signal $S_{IN}$ directly according to the pre-gain value to generate the pre-audio signal $S_{AUD-P}$.

The post-processing module 20 has a post-gain value. The post-processing module 20 receives and processes the pre-audio signal $S_{AUD-P}$ according to the post-gain value so as to generate an audio output signal $S_{OUT}$ to the playback unit 40 for being played. The playback unit 40 can be display hardware such as an earphone, speaker, etc. Besides processing the pre-audio signal $S_{AUD-P}$ according to the post-gain value, the post-processing module 20 can also performs other operations according to the requirements of the playback unit 40.

The processor 30 is for controlling the pre-processing module 10 and the post-processing module 20 dynamically. According to a volume adjustment signal $S_{AD}$, the processor 30 generates a pre-control signal $S_{CTRL1}$ and a post-control signal $S_{CTRL2}$, and transmits the pre-control signal $S_{CTRL1}$ and the post-control signal $S_{CTRL2}$ to the pre-processing module 10 and the post-processing module 20 respectively. Thus the pre-gain value of the pre-processing module 10 and the post-gain value of the post-processing module 20 are adjusted dynamically and correspondingly. The volume adjustment signal $S_{AD}$ is a signal for adjusting sound level played by the audio output device. There are various ways of the audio output device to generate the volume adjustment signal $S_{AD}$. For example, a hardware or software of the audio output device generates a signal when users rotate a volume control knob or drag mouse over a volume scroll bar on a computer screen.

After the playback unit 40 of the audio output device playing the sounds, users can operate the volume control device on the audio output device for volume adjustment. Then the processor 30 of the audio amplifier circuit in the audio output device receives the volume adjustment signal $S_{AD}$ and generates both the pre-control signal $S_{CTRL1}$ and the post-control signal $S_{CTRL2}$ according to the volume adjustment signal $S_{AD}$. The pre-control signal $S_{CTRL1}$ and the post-control signal $S_{CTRL2}$ are respectively transmitted to the pre-processing module 10 and the post-processing module 20. According to the pre-control signal $S_{CTRL1}$, the pre-processing module 10 processes the audio input signal $S_{IN}$ and generates the pre-audio signal $S_{AUD-P}$. The post-processing module 20 deals with the pre-audio signal $S_{AUD-P}$ according to the post-control signal $S_{CTRL2}$ to generate the audio output signal $S_{OUT}$. Thus the pre-gain value of the pre-processing module 10 and the post-gain value of the post-processing module 20 are adjusted dynamically to reduce effects of distortion and noises on the audio output signal $S_{OUT}$. Therefore the audio playback quality of the audio output device is improved.

More precisely, when users intend to decrease the volume level of the audio output device, the processor 30 turns the post-gain value of the post-processing module 20 down according to the volume adjustment signal $S_{AD}$. Thus noises are not over-amplified by the post-processing module 20 once the volume level played by the audio output device is reduced. Therefore the effect of noises on the audio output signal $S_{OUT}$ is reduced so as to avoid obvious noises while the playback unit 40 playing the audio output signal $S_{OUT}$. Moreover, the processor 30 turns the pre-gain value of the pre-processing module 10 up to keep the amplifier gain constant. On the other hand, when users want to increase the volume level of the audio output device, the processor 30 turns the pre-gain value of the pre-processing module 10 down according to the volume adjustment signal $S_{AD}$. Thus the pre-audio signal $S_{AUD-P}$ generated by the pre-processing module 10 is not easy to have distortion once the volume level played by the audio output device is increased. Therefore the audio output signal $S_{OUT}$ is not distorted. Moreover, the processor 30 turns the post-gain value of the post-processing module 20 up so as to keep the amplifier gain constant.

Based on the above details, the processor 30 generates the pre-control signal $S_{CTRL1}$ and the post-control signal $S_{CTRL2}$ dynamically according to the volume adjustment signal $S_{AD}$ so as to adjust the pre-gain value of the pre-processing module 10 and the post-gain value of the post-processing module 20 dynamically. In other words, the pre-control signal $S_{CTRL1}$ and the post-control signal $S_{CTRL2}$ respectively are corresponding to the pre-gain value and the post-gain value. The pre-control signal $S_{CTRL1}$ and the post-control signal $S_{CTRL2}$ generated by the processor 30 also vary as the volume level of the audio output device is changed by users. That means once users adjust the volume level played by the audio output device, the pre-processing module 10 and the post-processing module 20 respectively also changes the pre-gain value and the post-gain value for dynamically audio adjustment.

In addition, in this embodiment, the processor 30 is coupled to the pre-processing module 10 and the post-processing module 20. The processor 30 can also be a processor built inside the pre-processing module 10 or the post-processing module 20 for controlling the pre-processing module 10 or the post-processing module 20 dynamically. Thus the position of the processor of the audio amplifier circuit of the present invention is not limited. The processor that executes instructions is not limited to the processor inside the pre-processing module 10 or the post-processing module 20, the external processor 30, or other control circuit with the same functions.

Figure 2:
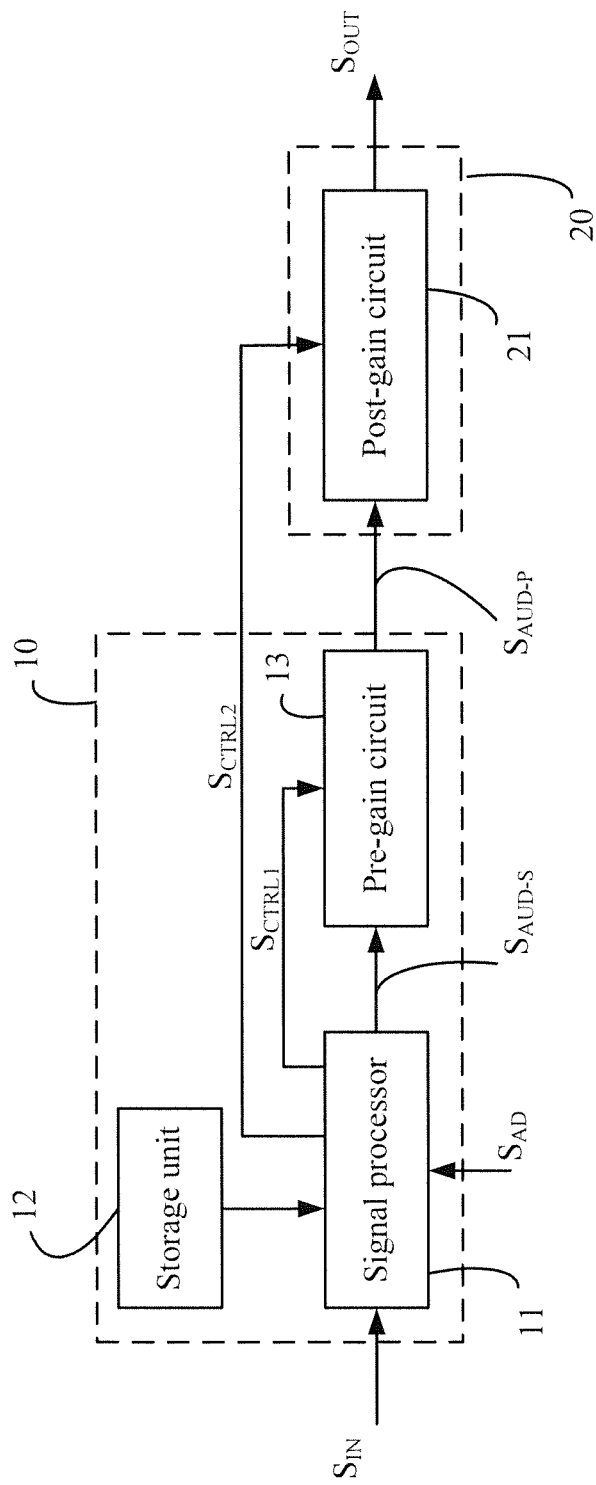
FIG. 2 is a block diagram of another embodiment according to the present invention.

Refer to FIG. 2, another embodiment of the present invention is provided. This embodiment of an audio amplifier circuit comprises a pre-processing module 10 and a post-processing module 20. The pre-processing module 10 consists of a signal processor 11, a storage unit 12 and a pre-gain circuit 13. The post-processing module 20 comprises a post-gain circuit 21. The signal processor 11 is for receiving the audio input signal $S_{IN}$ and performing common audio (signal) processing to generate an audio processing signal $S_{AUD-S}$. The common audio processes comprise equalization, stereo processing, multi-channel processing, etc. The signal processor 11 is not necessary to perform the audio processing to the audio input signal $S_{IN}$ and the audio input signal $S_{IN}$ is output directly to be the audio processing signal $S_{AUD-S}$. The pre-gain circuit 13 receives the audio processing signal $S_{AUD-S}$ and the pre-control signal $S_{CTRL1}$, and then amplifies the audio processing signal $S_{AUD-S}$ according to the pre-control signal $S_{CTRL1}$ so as to generate the pre-audio signal $S_{AUD-P}$. In other words, the pre-gain circuit 13 of the pre-processing module 10 processes the audio input signal $S_{IN}$ according to the pre-control signal $S_{CTRL1}$ to generate the pre-audio signal $S_{AUD-P}$.

Moreover, the signal processor 11 also controls the pre-gain circuit 13 and the post-gain circuit 21 dynamically. According to a volume adjustment signal $S_{AD}$, the signal processor 11 generates a pre-control signal $S_{CTRL1}$ and a post-control signal $S_{CTRL2}$, and transmits the control signals $S_{CTRL1}$, $S_{CTRL2}$, respectively to the pre-gain circuit 13 and the post-gain circuit 21 for adjusting the pre-gain value of the pre-gain circuit 13 and the post-gain value of the post-gain circuit 21 correspondingly and dynamically. In other words, the signal processor 11 is for controlling the pre-gain value of the pre-processing module 10 and the post-gain value of the post-processing module 20 dynamically.

As to the pre-gain circuit 13, it receives the audio processing signal $S_{AUD-S}$ and the pre-control signal $S_{CTRL1}$ and deals with the audio processing signal $S_{AUD-S}$ according to the pre-control signal $S_{CTRL1}$ so as to generate the pre-audio signal $S_{AUD-P}$. The post-gain circuit 21 receives both the pre-audio signal $S_{AUD-P}$ and the post-control signal $S_{CTRL2}$ and then amplifies the pre-audio signal $S_{AUD-P}$ according to the post-control signal $S_{CTRL2}$ so as to generate the audio output signal $S_{OUT}$.

In this embodiment, the signal processor 11 is used as a processor of the audio amplifier circuit of the present invention so as to control the pre-processing module 10 and the post-processing module 20 dynamically. In another embodiment of the present invention, the signal processor 11 and the pre-gain circuit 13 are respectively a digital signal processor (DSP) and a digital gain circuit. The storage unit 12 can be random access memory (RAM), read only memory (ROM), register, flash memory, or other storage media.

There are various ways of the audio amplifier circuit to generate the pre-control signal $S_{CTRL1}$ and the post-control signal $S_{CTRL2}$. One among them is according to the volume adjustment signal $S_{AD}$ and a look up table. This is only an embodiment of the present invention, not intend to limit that the processor can only generates the pre-control signal $S_{CTRL1}$ and the post-control signal $S_{CTRL2}$ according to the look up table. Moreover, the look up table is saved in the storage unit 12. The followings are details showing how the processor of the present invention generates the pre-control signal $S_{CTRL1}$ and the post-control signal $S_{CTRL2}$ according to the look up table.

Refer to the table one, the look up table comprises a plurality of volume reference levels, a plurality of pre-gain reference values and a plurality of post-gain reference values. In this embodiment, the maximum volume level is defined as 100 and is divided into 7 sections as reference data of volume levels. The volume reference levels comprises 0~20 section, 21~40 section, 41~50 section, 51~60 section, 61~70 section, 71~80 section, and 81~100 section. The total gain value is a sum of the pre-gain value and the post-gain value and is a fixed value. In this embodiment, the total gain value is 6 dB. The pre-gain reference values include 6 dB, 5 dB, 4 dB, 3 dB, 2 dB, 1 dB, and 0 dB while the post-gain reference values include 0 dB, 1 dB, 2 dB, 3 dB, 4 dB, 5 dB, and 6 dB. The 0~20 section of the volume reference level is corresponding to 6 dB of the reference data of pre-gain value and 0 dB of the reference data of post-gain value. The 21~40 section of the volume reference level is corresponding to 5 dB of the reference data of pre-gain value and 1 dB of the reference data of post-gain value. The rest can be deduced from them.

The signal processor 11 according one embodiment of the present invention can compare the volume adjustment signal $S_{AD}$ with the volume reference levels to find out which section of the volume reference levels that the volume adjustment signal $S_{AD}$ is corresponding to. The corresponding reference data of pre-gain value and the corresponding reference data of post-gain value are further obtained. For example, when users adjust the volume level to 30, the signal processor 11 receives the volume adjustment signal $S_{AD}$ that represents the volume level of 30 and then compares the volume adjustment signal $S_{AD}$ with the volume reference levels so as to learn the volume adjustment signal $S_{AD}$ is located at the 21~40 section. Thus the corresponding reference data of pre-gain value and the corresponding reference data of post-gain value are respectively 5 dB and 1 dB.

Thereby the signal processor 11 determines that the pre-gain value and the post-gain value respectively are 5 dB and 1 dB according to the reference data and generates the pre-control signal $S_{CTRL1}$ and the post-control signal $S_{CTRL2}$ correspondingly. Then the audio processing signal $S_{AUD-S}$ and the pre-audio signal $S_{AUD-P}$ are respectively adjusted dynamically by the pre-control signal $S_{CTRL1}$ and the post-control signal $S_{CTRL2}$ to generate the audio output signal $S_{OUT}$. Therefore the distortion and noises played by the audio output device are reduced.

TABLE 1

| Pre-processing module | | Post-processing module | | |
| --- | --- | --- | --- | --- |
| Volume reference level | Pre-gain reference value | Volume reference level | Post-gain reference value | Total gain (K) Total gain value |
| 0~20 | 6 dB | 0~20 | 0 dB | 6 dB |
| 21~40 | 5 dB | 21~40 | 1 dB | 6 dB |
| 41~50 | 4 dB | 41~50 | 2 dB | 6 dB |
| 51~60 | 3 dB | 51~60 | 3 dB | 6 dB |
| 61~70 | 2 dB | 61~70 | 4 dB | 6 dB |
| 71~80 | 1 dB | 71~80 | 5 dB | 6 dB |
| 81~100 | 0 dB | 81~100 | 6 dB | 6 dB |

Moreover, besides the scale of volume reference levels have polarity sections (such as 0~20, 21~40, 41~50, etc.), the scale of volume reference levels can also be the 1 unit per scale for adjustment such as (1, 2, 3, 4 . . . 100) used in comparisons, as shown in the following table two.

TABLE TWO

| Pre-processing module | | Post-processing module | | |
| --- | --- | --- | --- | --- |
| Volume reference level | Pre-gain reference value | Volume reference level | Post-gain reference value | Total gain (K) Total gain value |
| 1 | 10 dB | 1 | 0 dB | 10 dB |
| 2 | 9.9 dB | 2 | 0.1 dB | 10 dB |
| 3 | 9.8 dB | 3 | 0.2 dB | 10 dB |
| ≀ | ≀ | ≀ | ≀ | 10 dB |
| 99 | 0.1 dB | 99 | 9.9 dB | 10 dB |
| 100 | 0 dB | 100 | 10 dB | 10 dB |

The look up table comprises a plurality of volume reference levels, a plurality of pre-gain reference values and a plurality of post-gain reference values. In this embodiment, the maximum volume level is defined as 100 and is divided into 100 volume level scales (1, 2, 3 . . . 99, 100) as reference data of volume level. The pre-gain reference values include 10 dB, 9.9 dB and 9.8 dB . . . 0.1 dB, and 0 dB while the post-gain reference values comprises 0 dB, 0.1 dB, 0.2 dB . . . 9.9 dB, and 10 dB. The first volume level scale (volume level scale 1) of the volume reference levels is corresponding to 10 dB of the reference data of pre-gain value and 0 dB of the reference data of post-gain value. The second volume level scale (volume level scale 2) of the volume reference level is corresponding to 9.9 dB of the reference data of pre-gain value and 0.1 dB of the reference data of post-gain value. The rest can be deduced from them.

Once the user adjusts the volume level to be played to the volume level scale one, the signal processor 11 compares the volume adjustment signal $S_{AD}$ with the volume reference levels so as to obtain the reference data of pre-gain value 10 dB and the reference data of post-gain value 0 dB corresponding to the volume level scale 1. Then signal processor 11 determines that the pre-gain value is 10 dB and the post-gain value is 0 dB according to the above comparison of the reference data, and generates the pre-control signal $S_{CTRL1}$ corresponding to the pre-gain value and the post-control signal $S_{CTRL2}$ corresponding to the post-gain value. By the pre-control signal $S_{CTRL1}$ and the post-control signal $S_{CTRL2}$, the audio processing signal $S_{AUD-S}$ and the pre-audio signal $S_{AUD-P}$ are respectively adjusted dynamically to generate the audio output signal $S_{OUT}$ for reducing distortion and noises played by the audio output device.

Moreover, if the volume level the user intends to adjust is different from the volume reference levels in the look up table, the signal processor 11 is unable to get the volume reference level that corresponds to the volume adjustment signal $S_{AD}$. Then the signal processor 11 will find out the closest two reference data of volume level according to the volume adjustment signal $S_{AD}$ to get two reference data of pre-gain values and two reference data of post-gain values. Next a pre-gain value and a post-gain value are obtained by processing.

For example, if the user adjusts the volume to be played to volume level scale 1.5, the signal processor 11 compares the volume adjustment signal $S_{AD}$ with the volume reference levels and finds out two reference data of volume level most close to the volume adjustment signal $S_{AD}$, the volume level scale one and the volume level scale two. Then two reference data of pre-gain values 10 dB, 9.9 dB respectively corresponding to the volume level scale one and the volume level scale two are further obtained. The signal processor 11 processes 10 dB and 9.9 dB to get a new pre-gain value. The new pre-gain value can be 9.95 dB obtained by interpolation in the signal processor 11.

Similarly, the signal processor 11 gets two reference data of post-gain values 0 dB, 0.1 dB respectively correspond to the volume level scale one and the volume level scale two. The signal processor 11 processes 0 dB and 0.1 dB to get a new post-gain value of 0.05 dB. When the volume adjustment signal $S_{AD}$ is most close to the volume level scale 99 and 100, the signal processor 11 gets a pre-gain value 0.05 dB and a post-gain value 9.95 dB by processing. Other volume adjustment signal $S_{AD}$ that is unable to be matched with one of the volume reference levels can be processed in such way so as to get the pre-gain value and the post-gain value.

Even the volume level the user intend to adjust the volume reference level is different from the volume reference levels in the look up table, the signal processor 11 can still determines and gets the pre-gain value and the post-gain value according to the pre-gain reference values and the post-gain reference values. And then the signal processor 11 generates a pre-control signal $S_{CTRL1}$ corresponding to the pre-gain value and a post-control signal $S_{CTRL2}$ corresponding to the post-gain value. By the pre-control signal $S_{CTRL1}$ and the post-control signal $S_{CTRL2}$, the audio processing signal $S_{AUD-S}$ and the pre-audio signal $S_{AUD-P}$ are adjusted dynamically so as to minimize distortion and noises of the audio output device. This is only an embodiment of the present invention and the processing method is not limited. Other methods can also be used to get the pre-gain value and the post-gain value.

Figure 3:
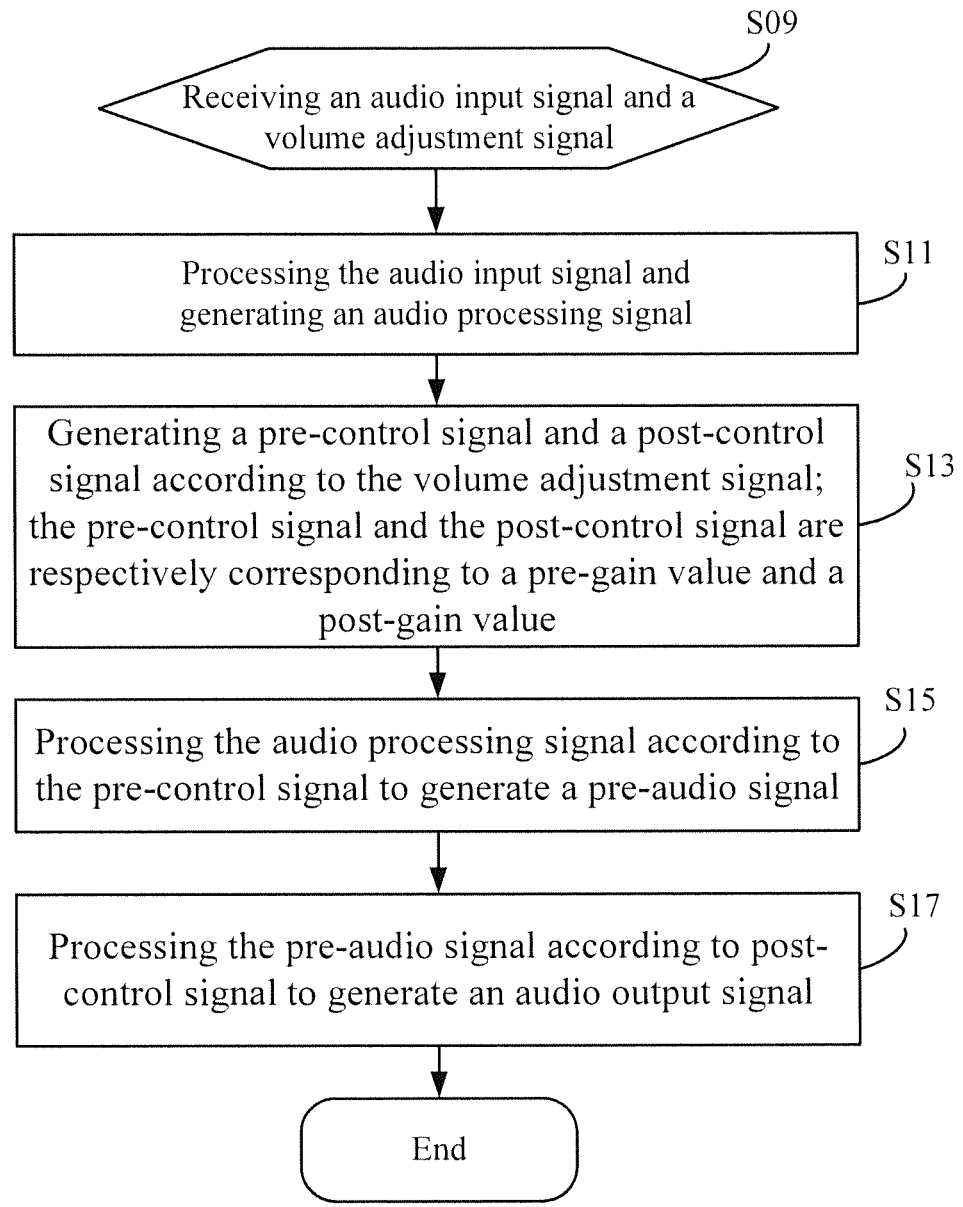
FIG. 3 is a flow chart of an embodiment according to the present invention.

Refer to FIG. 3, a flow chart of an embodiment is disclosed. An audio amplification method comprises a plurality of steps. As shown in the step S09, a pre-processing module 10 receives an audio input signal $S_{IN}$ and a volume adjustment signal $S_{AD}$. Then refer to the step S11, the pre-processing module 10 deals with the audio input signal $S_{IN}$ and generates an audio processing signal $S_{AUD-S}$. Or the pre-processing module 10 doesn't deal with the audio input signal $S_{IN}$ and directly output the audio input signal $S_{IN}$ as the audio processing signal $S_{AUD-S}$. Next as shown in the step S13, the signal processor 11 generates a pre-control signal $S_{CTRL1}$ and a post-control signal $S_{CTRL2}$ respectively according to the volume adjustment signal $S_{AD}$ while the pre-control signal $S_{CTRL1}$ and the post-control signal $S_{CTRL2}$ are corresponding to a pre-gain value and a post-gain value respectively.

Refer to the step S15, a pre-gain circuit 13 receives both the pre-control signal $S_{CTRL1}$ and the audio processing signal $S_{AUD-S}$, and adjusts the audio processing signal $S_{AUD-S}$ according to the pre-control signal $S_{CTRL1}$ so as to generate a pre-audio signal $S_{AUD-P}$. Later as shown in the step S17, a post-gain circuit 21 of a post-processing module 20 receives both the pre-audio signal $S_{AUD-P}$ and the post-control signal $S_{CTRL2}$, and adjusts the pre-audio signal $S_{AUD-P}$ according to the post-control signal $S_{CTRL2}$ so as to generate an audio output signal $S_{OUT}$. Thus the audio amplification method of the present invention reduces distortion and noises, generates and transmits the audio output signal $S_{OUT}$ to the playback unit 40 for playing original sound quality of the audio input signal $S_{IN}$.

Figure 4:
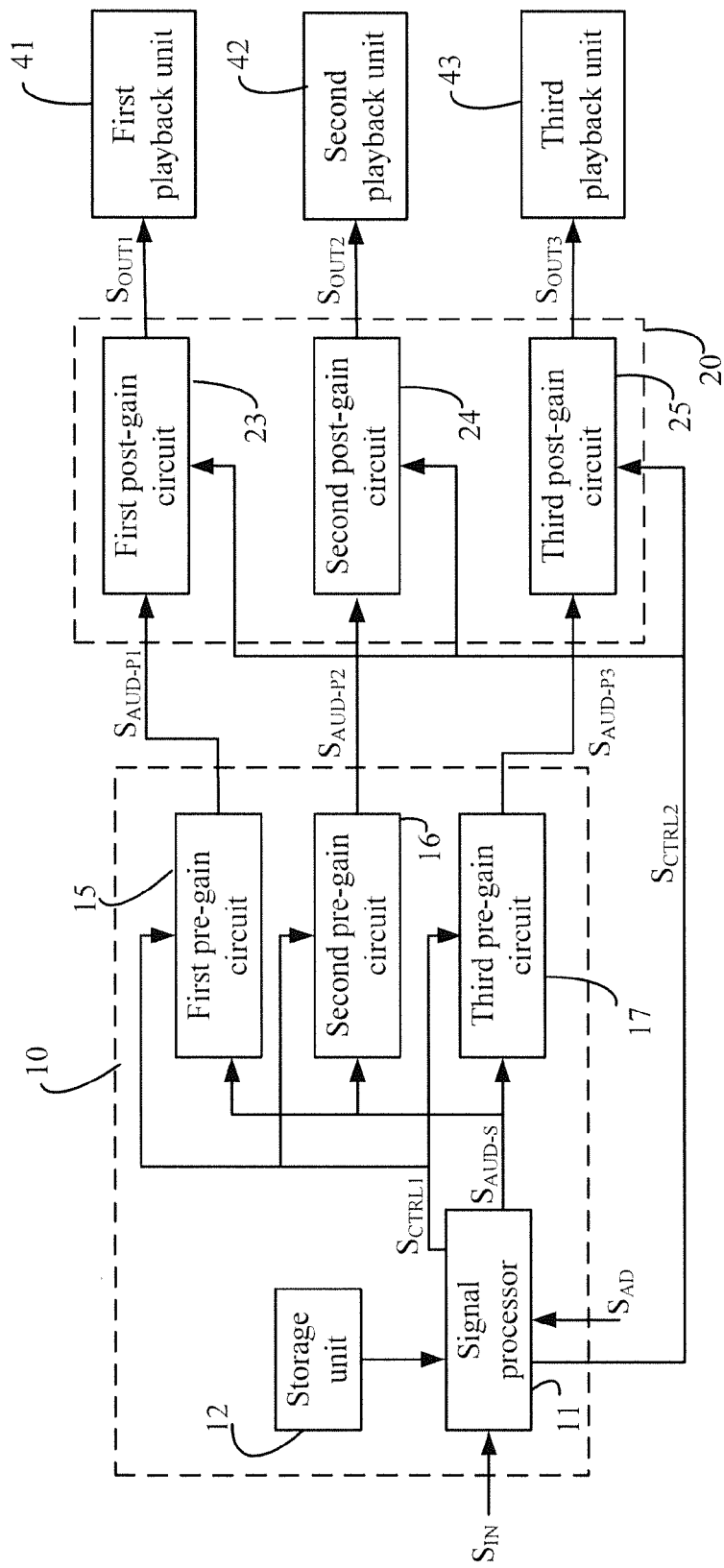
FIG. 4 is a block diagram of a further embodiment according to the present invention.

Refer to FIG. 4, a further embodiment is provided. The difference between this embodiment and the previous embodiment is in that this embodiment comprises a plurality of playback units 41, 42, 43. Thus the pre-processing module 10 also comprises a plurality of pre-gain circuits 15, 16, 17 and the post-processing module 20 comprises a plurality of post-gain circuits 23, 24, 25. The details are described in the followings.

The first, the second and the third playback units 41, 42, 43 are operating independently under different conditions. Thus the first post-gain circuit 23, the second post-gain circuit 24, and the third post-gain circuit 25 of the post-processing module 20 respectively provides the first playback unit 41, the second playback unit 42, and the third playback unit 43 different audio output signals $S_{OUT1}$, $S_{OUT2}$, $S_{OUT3}$ according to various requirements of the playback units 41, 42, 43. Moreover, in audio amplifier circuit of the present invention, the post-processing module 20 is used in combination with the pre-processing module 10 to generate the audio output signals $S_{OUT1}$, $S_{OUT2}$, $S_{OUT3}$. Thus the pre-processing module 10 also comprises the first pre-gain circuits 15, the second pre-gain circuit 16, and the third pre-gain circuit 17 so as to be used together with the first post-gain circuit 23, the second post-gain circuit 24, and the third post-gain circuit 25 of the post-processing module 20 respectively, meeting respective requirement of the first playback unit 41, the second playback unit 42, and the third playback unit 43.

When users change the volume level to be played, the volume adjustment signal $S_{AD}$ also changes. The signal processor 11 generates a pre-control signal $S_{CTRL1}$ and a post-control signal $S_{CTRL2}$ according to the volume adjustment signal $S_{AD}$. The first pre-gain circuits 15, the second pre-gain circuit 16, or the third pre-gain circuit 17 respectively processes the audio processing signal $S_{AUD-S}$ according to the pre-control signal $S_{CTRL1}$ and generates a first pre-audio signal $S_{AUD-P1}$, a second pre-audio signal $S_{AUD-P2}$ or a third pre-audio signal $S_{AUD-P1}$. Moreover, the first post-gain circuit 23, the second post-gain circuit 24, or the third post-gain circuit 25 respectively processes the pre-audio signal $S_{AUD-P1}$, the pre-audio signal $S_{AUD-P2}$ or a pre-audio signal $S_{AUD-P3}$ according to the post-control signal $S_{CTRL2}$ and generates an first audio output signal $S_{AUD-P1}$, a second audio output signal $S_{AUD-P2}$ or a third audio output signal $S_{AUD-P3}$. Thus the audio output signals $S_{OUT1}$, $S_{OUT2}$, $S_{OUT3}$ have been processed dynamically to reduce distortion and noises and the playback unit 41, the second playback unit 42, and the third playback unit 43 respectively received the first audio output signal $S_{AUD-P1}$, the second audio output signal $S_{AUD-P2}$ and the third audio output signal $S_{AUD-P3}$ can play sounds with low noise and low distortion and provide users better listening quality.

In addition, in this embodiment, the pre-control signal $S_{CTRL1}$ and the post-control signal $S_{CTRL2}$ is used to control the pre-gain circuits 15, 16 and 17 and the post-gain circuits 23, 24 and 25 respectively. In other embodiment, a plurality of the pre-control signal $S_{CTRL1}$ and the post-control signal $S_{CTRL2}$ can be used to control the pre-gain circuits 15, 16, 17 and the post-gain circuits 23, 24 and 25 respectively.

In summary, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. An audio amplifier circuit comprising:
   a processor that receives a volume adjustment signal and generates a pre-control signal and a post-control signal according to the volume adjustment signal;
   a pre-processing module that receives an audio input signal and the pre-control signal, and adjusts a pre-gain value of the pre-processing module and processes the audio input signal according to the pre-control signal to generate a pre-audio signal; and
   a post-processing module that receives the pre-audio signal and the post-control signal, and adjusts a post-gain value of the post-processing module and processes the pre-audio signal according to the post-control signal to generate an audio output signal.

2. The audio amplifier circuit as claimed in claim 1, wherein the processor generates the pre-control signal and the post-control signal further according to the volume adjustment signal and a look up table.

3. The audio amplifier circuit as claimed in claim 2, wherein the audio amplifier circuit further comprising:
   a storage unit that saves the look up table; the look up table comprises a plurality of volume reference levels, a plurality of pre-gain reference values and a plurality of post-gain reference values; the volume reference levels are corresponding to the pre-gain reference values and the post-gain reference values; the processor determines the pre-gain value and the post-gain value according to the volume adjustment signal and the volume reference level to generate the pre-control signal and the post-control signal.

4. The audio amplifier circuit as claimed in claim 1, wherein the sum of the pre-gain value and the post-gain value is a fixed gain value.

5. The audio amplifier circuit as claimed in claim 1, wherein the pre-processing module comprising a pre-gain circuit that processes the audio input signal according to the pre-control signal to generate the pre-audio signal.

6. The audio amplifier circuit as claimed in claim 5, wherein the pre-processing module further comprising a signal processor that receives and processes the audio input signal to generate an audio processing signal; the pre-gain circuit receives the audio processing signal and amplifies the audio processing signal according to the pre-control signal to generate the pre-audio signal; wherein the signal processor is the processor that generates the pre-control signal and the post-control signal according to the volume adjustment signal.

7. The audio amplifier circuit as claimed in claim 1, wherein the post-processing module comprising a post-gain circuit that receives the pre-audio signal and the post-control signal, and amplifies the pre-audio signal according to the post-control signal to generate the audio output signal.

8. An audio amplification method comprising the steps of:
   receiving an audio input signal and a volume adjustment signal;
   generating a pre-control signal and a post-control signal according to the volume adjustment signal; the pre-control signal and the post-control signal respectively corresponding to a pre-gain value and a post-gain value;
   adjusting the pre-gain value and processing the audio input signal according to the pre-control signal to generate a pre-audio signal; and
   adjusting the post-gain value and processing the pre-audio signal according to post-control signal to generate an audio output signal.

9. The method as claimed in claim 8, wherein the step of generating a pre-control signal and a post-control signal according to the volume adjustment signal further comprising a step of generating the pre-control signal and the post-control signal according to the volume adjustment signal and a look up table.

10. The method as claimed in claim 9, wherein the look up table comprises a plurality of volume reference levels, a plurality of pre-gain reference values and a plurality of post-gain reference values; the volume reference levels are corresponding to the pre-gain reference values and the post-gain reference values; wherein the step of generating the pre-control signal and the post-control signal according to the volume adjustment signal and the look up table further comprises a step of determining the pre-gain value and the post-gain value according to the volume adjustment signal and the volume reference level to generate the pre-control signal and the post-control signal.

11. The method as claimed in claim 8, wherein the sum of the pre-gain value and the post-gain value is a fixed gain value.

12. The method as claimed in claim 8, wherein the method further comprising a step of:
   processing the audio input signal to generate an audio processing signal and then processing the audio processing signal according to the pre-control signal to generate the pre-audio signal.

* * * * *